(12) United States Patent
Reznicek et al.

(10) Patent No.: US 10,068,920 B2
(45) Date of Patent: Sep. 4, 2018

(54) SILICON GERMANIUM FINS ON INSULATOR FORMED BY LATERAL RECRYSTALLIZATION

(71) Applicant: GLOBALFOUNDRIES INC., Grand Cayman (KY)

(72) Inventors: Alexander Reznicek, Troy, NY (US); Veeraraghavan S. Basker, Schenectady, NY (US); Shogo Mochizuki, Clifton Park, NY (US); Nicolas L. Breil, Mountain View, CA (US); Oleg Gluschenkov, Tannersville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 47 days.

(21) Appl. No.: 15/098,722

(22) Filed: Apr. 14, 2016

(65) Prior Publication Data

US 2017/0301697 A1 Oct. 19, 2017

(51) Int. Cl.
| | |
|---|---|
| *H01L 27/12* | (2006.01) |
| *H01L 21/84* | (2006.01) |
| *H01L 21/02* | (2006.01) |
| *H01L 29/66* | (2006.01) |
| *H01L 21/3115* | (2006.01) |
| *H01L 21/324* | (2006.01) |

(52) U.S. Cl.
CPC ...... *H01L 27/1211* (2013.01); *H01L 21/0217* (2013.01); *H01L 21/02164* (2013.01); *H01L 21/02532* (2013.01); *H01L 21/02592* (2013.01); *H01L 21/02623* (2013.01); *H01L 21/31155* (2013.01); *H01L 21/324* (2013.01); *H01L 21/845* (2013.01); *H01L 29/6653* (2013.01)

(58) Field of Classification Search
CPC .................................................. H01L 27/1211
See application file for complete search history.

(56) References Cited

U.S. PATENT DOCUMENTS

| | | | |
|---|---|---|---|
| 7,601,570 B2 | 10/2009 | Damlencourt | |
| 7,993,999 B2 | 8/2011 | Basker et al. | |
| 8,048,723 B2 | 11/2011 | Chang et al. | |
| 8,211,772 B2 | 7/2012 | Kavalieros et al. | |
| 8,395,195 B2 | 3/2013 | Chang et al. | |
| 8,541,286 B2 * | 9/2013 | Park ............... | H01L 21/823431 257/E21.442 |
| 8,685,842 B2 | 4/2014 | Oda et al. | |
| 8,703,565 B2 | 4/2014 | Chang et al. | |
| 9,455,199 B1 * | 9/2016 | Jacob ............. | H01L 21/823807 |
| 9,595,599 B1 * | 3/2017 | Bu ................. | H01L 29/6681 |

(Continued)

FOREIGN PATENT DOCUMENTS

CN 101752258 B 9/2011

*Primary Examiner* — Meiya Li
*Assistant Examiner* — Shih Tsun A Chou
(74) *Attorney, Agent, or Firm* — Anthony Canale; Andrew M. Calderon; Roberts Mlotkowski Safran Cole & Calderon, P.C.

(57) ABSTRACT

Relaxed silicon germanium fins are formed on a bulk silicon substrate through the lateral recrystallization of molten silicon germanium having high germanium content. Following formation of the silicon germanium fins, the silicon is selectively recessed. The resulting trenches are filled with electrically insulating material and then recessed down to the bottoms of the fins.

15 Claims, 5 Drawing Sheets

(56) References Cited

U.S. PATENT DOCUMENTS

| | | | | |
|---|---|---|---|---|
| 2002/0168864 | A1* | 11/2002 | Cheng | H01L 21/76256 438/725 |
| 2005/0040444 | A1* | 2/2005 | Cohen | H01L 21/823412 257/288 |
| 2011/0147811 | A1* | 6/2011 | Kavalieros | H01L 29/66795 257/288 |
| 2011/0227165 | A1 | 9/2011 | Basker et al. | |
| 2012/0241818 | A1 | 9/2012 | Kavalieros et al. | |
| 2012/0319211 | A1* | 12/2012 | van Dal | H01L 29/66795 257/401 |
| 2014/0264600 | A1* | 9/2014 | Adam | H01L 29/66795 257/347 |
| 2014/0357034 | A1* | 12/2014 | Cheng | H01L 29/785 438/275 |
| 2014/0367800 | A1* | 12/2014 | Lee | H01L 27/12 257/402 |
| 2015/0001591 | A1* | 1/2015 | Akarvardar | H01L 29/785 257/288 |
| 2015/0021663 | A1* | 1/2015 | Akarvardar | H01L 29/785 257/192 |
| 2015/0021691 | A1* | 1/2015 | Akarvardar | H01L 29/66795 257/349 |
| 2015/0028348 | A1* | 1/2015 | Jacob | H01L 29/785 257/77 |
| 2015/0054121 | A1* | 2/2015 | He | H01L 29/66795 257/506 |
| 2015/0069465 | A1* | 3/2015 | Cheng | H01L 29/1054 257/190 |
| 2015/0076561 | A1* | 3/2015 | Cheng | H01L 27/1211 257/192 |
| 2015/0115370 | A1* | 4/2015 | Liu | H01L 27/0886 257/401 |
| 2015/0294912 | A1* | 10/2015 | Xie | H01L 27/0886 438/283 |
| 2016/0064288 | A1* | 3/2016 | Cheng | H01L 29/165 257/192 |
| 2017/0098697 | A1* | 4/2017 | Bu | H01L 29/6681 |

* cited by examiner

SILICON GERMANIUM FINS ON INSULATOR FORMED BY LATERAL RECRYSTALLIZATION

FIELD

The present disclosure relates to the physical sciences, and, more particularly, to non-planar structures employed in FinFET devices and methods of fabrication thereof.

BACKGROUND

Fin-type field-effect transistors (FinFETs) have three-dimensional, non-planar configurations including fin-like structures extending above substrates. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is set by oxide thickness and etched fin height. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed immediately following fin patterning. Gate-last procedures can involve making a dummy gate, fabricating other elements of the transistor, removing the dummy gate, and replacing the removed dummy gate with actual gate materials. FinFET devices including silicon germanium fins enable improvements in performance with respect to silicon-based devices. Channel materials including high germanium content offer potential for developing 7 nm and later nodes. The formation of silicon germanium or pure germanium on silicon is challenging due to the high lattice mismatch, which may be 3.6% or more. Growing such material can lead to high defect densities due to dislocations and stacking faults. The layers are accordingly grown very thick in order to trap most of the defects at the interface and relax the silicon germanium material as the growth progresses.

SUMMARY

Principles of the present disclosure provide an exemplary fabrication method that includes obtaining a structure comprising a bulk silicon substrate including a plurality of parallel silicon fins, a dielectric layer on the substrate and extending between the silicon fins, and a spacer adjoining a lateral side of each silicon fin. A layer of silicon germanium is deposited on the substrate and between the fins. Crystalline silicon germanium fins are formed on the dielectric layer by annealing and then cooling the substrate, thereby causing liquid phase epitaxial regrowth of the silicon germanium layer. The fabrication method further includes selectively recessing the silicon fins, thereby forming trenches between the silicon germanium fins, removing the spacers, and depositing an electrically insulating material within the trenches.

A finned semiconductor structure provided in accordance with the principles discussed herein includes a a silicon substrate, a plurality of parallel silicon fins extending from the silicon substrate, a dielectric layer on the silicon substrate and covering the silicon fins, and a plurality of relaxed parallel silicon germanium fins directly contacting a top surface of the dielectric layer. The silicon fins are vertically aligned with parallel trenches between the silicon germanium fins.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Finned structures, including devices made from such finned structures, and fabrication methods as disclosed herein can provide substantial beneficial technical effects. For example, one or more embodiments may provide one or more of the following advantages:

High channel mobility and current drive;
Fully relaxed and defect-free silicon germanium fins;
Tall, high germanium percentage silicon germanium fins;
Integratable with FinFET CMOS process flow.

These and other features and advantages will become apparent from the following detailed description of illustrative embodiments thereof, which is to be read in connection with the accompanying drawings.

DETAILED DESCRIPTION

FinFET structures are characterized by fins formed on semiconductor substrates. Such substrates include bulk silicon substrates (fin on bulk) and SOI substrates (fin on SOI) as discussed above. The exemplary processes discussed below are described with respect to fabrication of FinFET devices from bulk silicon substrates. Exemplary steps that may be performed sequentially in fabricating FinFET devices are schematically illustrated in the figures. Fabrication may commence with a partially completed structure, in which case one or more of the steps described below could be omitted.

Figure 1:
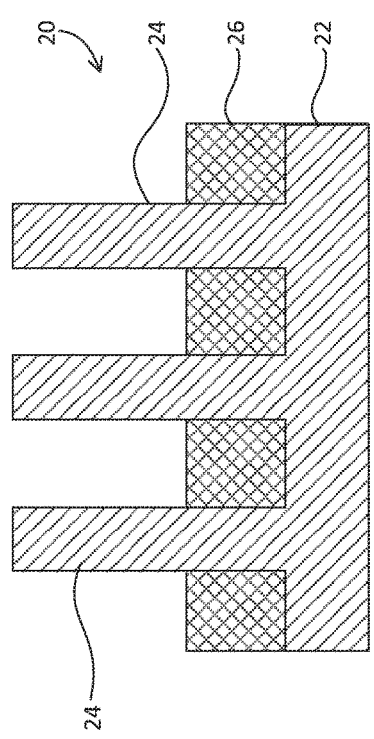
FIG. 1 is a schematic, sectional illustration of a structure including a bulk silicon substrate including silicon germanium fins and a dielectric layer.

A structure 20 including a monocrystalline silicon substrate 22 consisting of essentially undoped monocrystalline silicon and integral silicon fins 24 on the substrate is shown schematically in FIG. 1, it being appreciated that standard silicon substrates may have a very low level of p-doping. The substrate may be in the form of a wafer. Fin pitch is 25-50 nm and fin heights are 25-60 nm in one or more embodiments. A smaller pitch of 30-45 nm is employed in other embodiments. Fin width is six to ten nanometers (6-10 nm) in exemplary embodiments. A dielectric layer 26 is within the trenches. The dielectric layer 26 may be formed by filling the high aspect ratio trenches between the fins 24 and then performing a timed etch to obtain the required dielectric thickness. For example, the areas between the fins 24 may be filled with a dielectric material such as an oxide (for example silicon dioxide ($SiO_2$)), forming isolation regions. Such material can be deposited in accordance with conventional techniques such as high plasma density deposition. The thicknesses of the isolation regions can be engineered by oxide fill, then CMP (chemical mechanical planarization), and then timed recess RIE (reactive ion etch). Fin heights are measured from the top surface of the dielectric layer 26. While the fins 24 are shown as having vertical side walls and horizontal top surfaces in the schematic illustrations, it will be appreciated that fins in FinFET structures may have somewhat different configurations such as triangular configurations wherein the fin bases are wider than the tops of the fins. For example, tapered fins formed on bulk silicon substrates facilitate filling the cavities between fins with oxide materials without forming voids. The structure 20 may accordingly include silicon fins 24 having sides that are not completely vertical. Fin heights are preferably equal. Fin heights, widths and spacing are further chosen in accordance with manufacturer preferences. The side walls of the silicon fins 24 are (110) surfaces in some embodiments and (100) surfaces in other embodiments. As discussed above, the side walls of the silicon fins 24 may not be exactly vertical. Surfaces described as (110) surfaces herein are at least close to being (110) surfaces but may or may not be exactly (110) surfaces.

Figure 3:
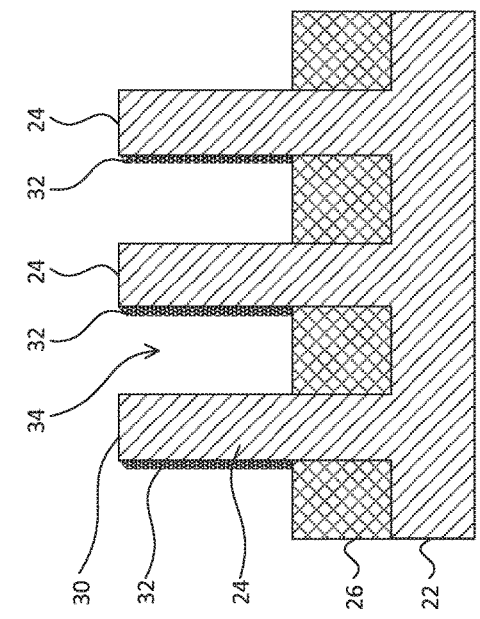
FIG. 3 is a schematic, sectional illustration of the structure shown in FIG. 2 following selective removal of portions of the conformal liner.
Figure 2:
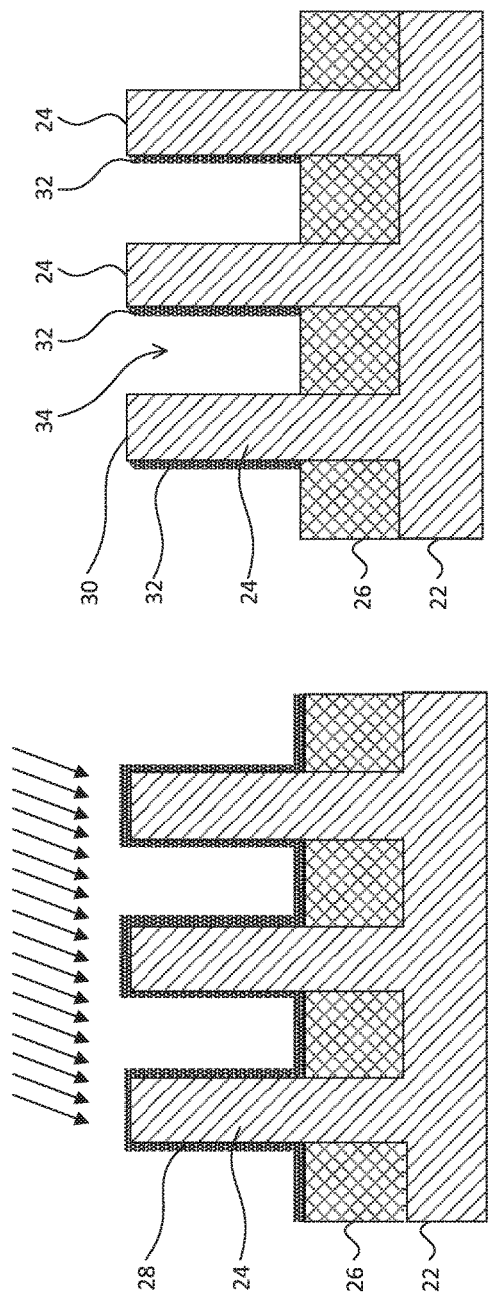
FIG. 2 is a schematic, sectional illustration of the structure shown in FIG. 1 including a conformal liner deposited on the fins and dielectric layer.

Asymmetric spacers are formed on the silicon fins 24 to allow subsequent epitaxial growth only from one sidewall of each fin; growth from both sidewalls would create a seam and hence defects in the epitaxial material. A silicon nitride ($Si_3N_4$) layer is deposited via CVD, PECVD, sputtering, or other suitable technique, forming a liner 28 as shown in FIG. 2. The conformal nitride layer is subjected to an angled, low-energy ion implantation process to damage selected portions thereof by breaking Si-N bonds while leaving other portions of the liner unaffected. The damaged nitride material is removed using a selective etch, for example an anisotropic etch such as a reactive ion etch or a plasma etch. The damaged portions of the liner 28 on the tops and one side of each fin are accordingly removed, leaving the undamaged portions of the nitride liner in place on the opposite sides of the silicon fins 24. A structure 30 including asymmetric nitride spacers 32, each spacer adjoining one side of each silicon fin 24, is accordingly obtained as shown in FIG. 3. Spacer thickness is between four and twelve nanometers (4-12 nm), in some embodiments; a thickness between six to eight nanometers (6-8 nm) preferred.

Figure 4:
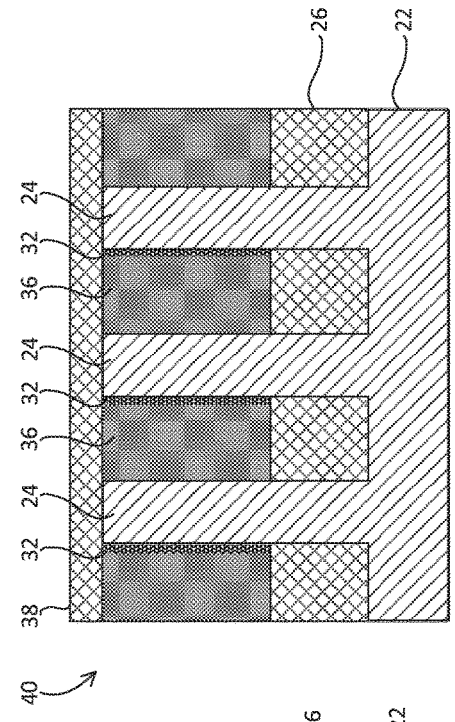
FIG. 4 is a schematic, sectional illustration of the structure shown in FIG. 3 following deposition of a silicon germanium layer.
Figure 5:
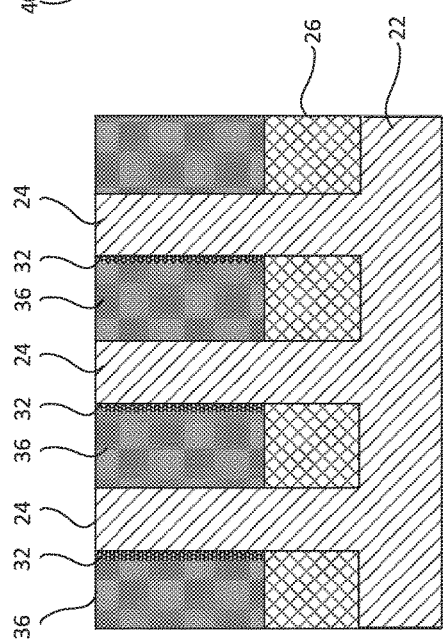
FIG. 5 is a schematic, sectional illustration of the structure shown in FIG. 4 following deposition of an oxide cap.

Referring to FIG. 4, an essentially undoped, amorphous silicon germanium layer 36 is deposited within the trenches 34 of the finned structure 30 in accordance with an exemplary embodiment. Precursor gases such as silane and germane are employed in some embodiments for forming the silicon germanium layer having the desired ratio of silicon and germanium. Plasma enhanced chemical vapor deposition (PECVD) may be employed to form the amorphous silicon germanium layer. In one or more embodiments, the amorphous silicon germanium layer contains fifty to ninety-nine percent (50-99%) germanium ($Si_{1-x}Ge_x$ where x is in the range of 0.50-0.99). The germanium content is eighty-five percent (85%) or greater in some embodiments. The resulting structure is then optionally subjected to chemical mechanical planarization (CMP). An oxide cap layer 38 such as a silicon dioxide layer is formed using chemical vapor deposition (CVD) on the top surface of the structure to obtain a structure 40 as schematically illustrated in FIG. 5. The cap layer 38 covers the top surfaces of the silicon fins, the silicon germanium regions, and the spacers 32 and has a thickness of one hundred to five hundred nanometers (100-500 nm) in exemplary embodiments.

Figure 6:
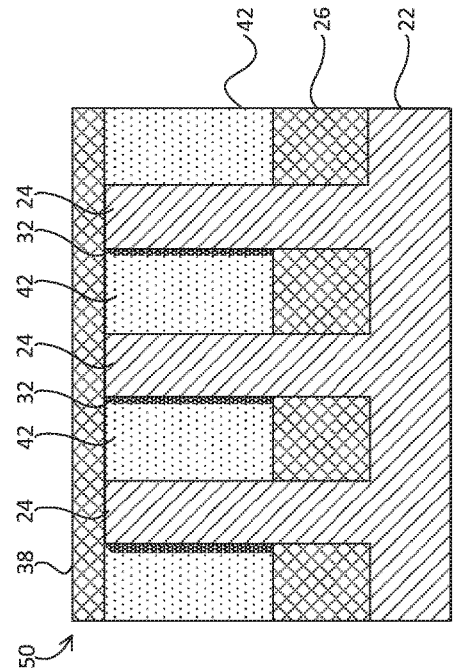
FIG. 6 is a schematic, sectional illustration of the structure shown in FIG. 5 undergoing laser annealing.

The structure 40 is subjected to laser annealing with fast cooling though the silicon substrate 22, as schematically illustrated in FIG. 6. Molten silicon germanium regions are formed during the annealing process. The melting point of silicon germanium is dependent on the concentration of germanium therein. In a $Si_{1-x}Ge_x$ alloy, greater amounts of silicon (and less germanium) are characterized by higher melting points. The following formula has been used to approximate the melting point of silicon germanium alloys: $T_1 \approx (1412-80x-395x^2)°$ C. by Stohr et al., *Z. Anorg. Allgem. Chem.* 241 (1954). As used herein, "melting point" refers to the temperature of which a solid may turn into a liquid, also known as "liquidus" for the binary SiGe alloy. The anneal temperature ramp up rate is preferably kept high prior to melting the amorphous silicon germanium layer 36. The annealing duration is also preferably kept short. Rapid thermal annealing (RTA), widely used in the semiconductor industry, has a typical ramp up rate of ~100° C/s. Laser and flash lamp annealing, which allow limiting elevated temperature processing to layer(s) near the substrate surface, is a preferred technique that may be employed. Such annealing has been employed to quickly raise surface layer temperatures followed by rapid cool-down. Millisecond-scale laser and flash annealing has ramp up rates in excess of 1,000,000° C/s and nanosecond-scale laser annealing has them in excess of 10,000,000,000° C/s. High temperature exposure times are in the range of tens of nanoseconds to milliseconds in one or more embodiments while the annealing temperature is greater than the melting point of the SiGe layer 36. In some exemplary embodiments, a pulsed nanosecond (100-250 nsec) laser anneal is employed. Nanosecond-scale laser annealing is preferred in one or more embodiments. Laser annealing in the millisecond range or longer using, for example, a scanning millisecond laser anneal tool or a flash annealing tool, may also feasible for causing melting of the amorphous SiGe layer 36. Rapid thermal anneal (RTA) processes, which conventionally heat substrates for half a second or longer, may or may not be feasible. The $Si_{1-x}Ge_x$ layer 36 in the molten state is schematically illustrated in FIG. 6. Displacement of the molten layer is avoided by limiting the time spent in the molten state. The silicon fins 24, dielectric layer 26, cap 38 and spacers 32, all having substantially higher melting points than the silicon germanium layer 36, remain in solid states during the annealing stage.

Figure 7:
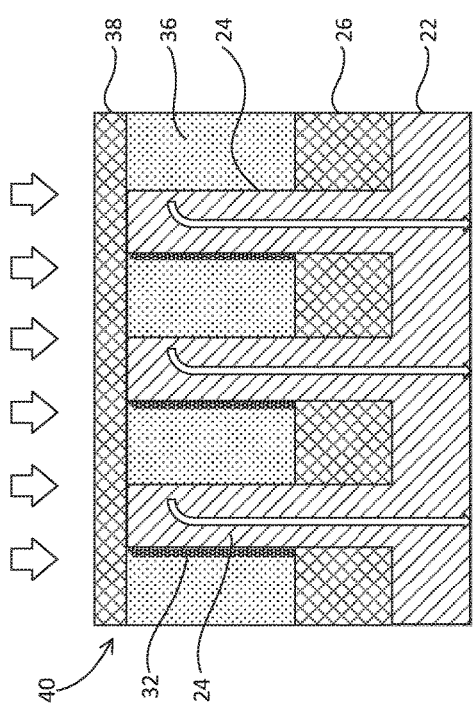
FIG. 7 is a schematic, sectional illustration of the structure shown in FIG. 6 following cooling to obtain a metastable silicon germanium layer.

Substantially defect-free, metastable silicon germanium regions are grown laterally in adjoining relation to the silicon fins 24 via liquid phase epitaxial regrowth. Dislocation/stacking faults are not introduced during recrystallization of the silicon germanium layer 36, resulting in a structure 50 having fully relaxed, crystalline silicon germanium fins 42 directly contacting the dielectric layer 26 as shown in FIG. 7. As condensation is substantially avoided during laser annealing, the ratio of germanium to silicon in the fins 42 is substantially the same as that in the amorphous silicon germanium layer 36. In contrast, defect densities of 5e8-5e9/cm$^2$ are observed when silicon germanium fins are formed from graded silicon germanium layers grown on silicon as the defects still propagate to the surface. Growth of relatively thick stacks of layers to compensate for lattice mismatch, sometimes five to ten microns or more, are also avoided using the techniques disclosed herein.

Figure 8:
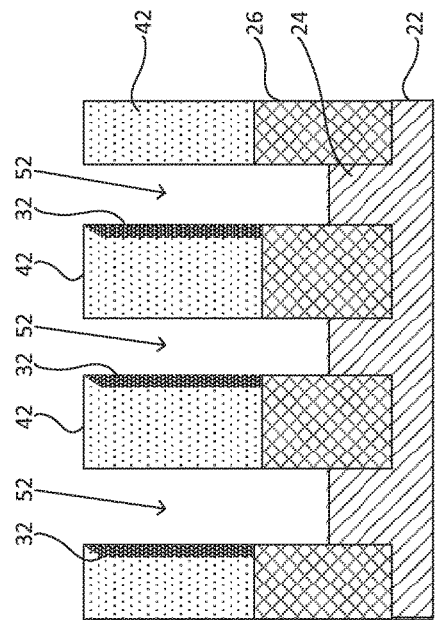
FIG. 8 is a schematic, sectional illustration of the structure shown in FIG. 7 following removal of the oxide cap.
Figure 9:
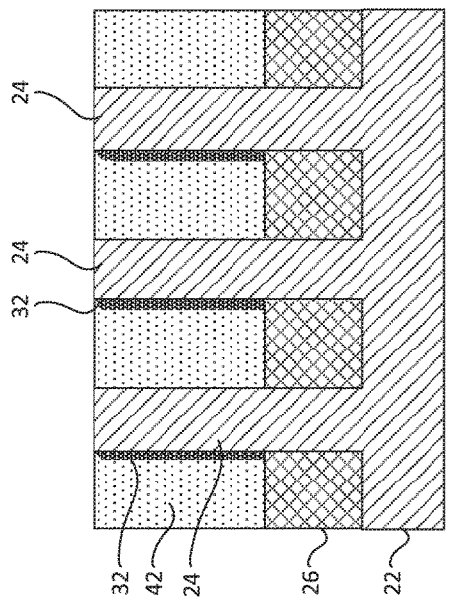
FIG. 9 is a schematic, sectional illustration of the structure shown in FIG. 8 following selective recessing of the silicon fins.
Figure 10:
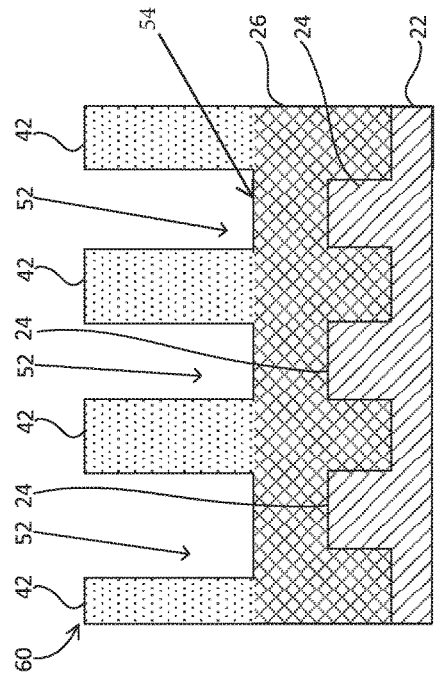
FIG. 10 is a schematic, sectional illustration of the structure shown in FIG. 9 following removal of the remaining portions of the conformal liner.
Figure 11:
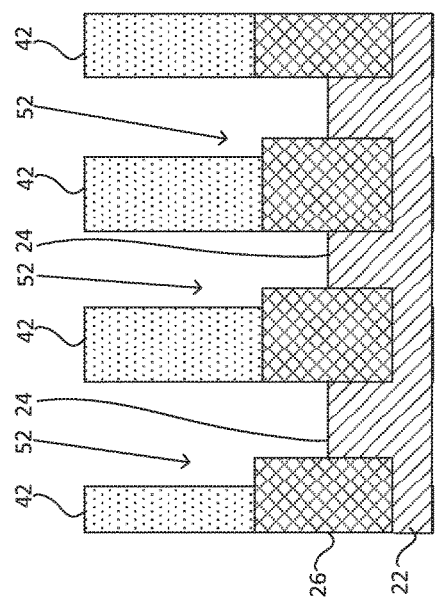
FIG. 11 is a schematic, sectional illustration of the structure shown in FIG. 10 following deposition of an oxide layer.

The oxide cap layer 38 is removed from the structure 50 using a buffered oxide etch (BOE) or other suitable process. The structure shown in FIG. 8 is then subjected to the selective recessing of silicon with respect to silicon germanium. The etch is discontinued prior to reaching the bottom of the dielectric layer 26, as shown in FIG. 9. Portions of the silicon fins 24 remain in some embodiments, but the top surfaces thereof are well below the top surface of the dielectric layer 26. Trenches 52 are accordingly formed between the silicon germanium fins 42 and the underlying portions of the dielectric layer 26. The nitride spacers 32 remain on the silicon germanium fins. As shown in FIG. 10, the nitride spacers are selectively removed using, for example, hot phosphoric acid. Upon such removal, one lateral side of each fin 42 is substantially coplanar with the portion of the dielectric layer 26 on which it is formed while the other lateral side thereof forms a shoulder with the underlying portion of the dielectric layer 26. The trenches 52 are filled with dielectric material 54. The dielectric materials used to fill the trenches between the silicon fins of the bulk substrate 22 and the trenches between the silicon germanium fins 42 are the same in some embodiments, for example silicon dioxide. The dielectric material 54 is etched back to the same level as the top surface of the originally formed dielectric layer 26 on which the fins 42 are positioned. As shown in FIG. 11, a structure 60 is thereby obtained which includes substantially defect-free crystalline silicon germanium fins 42 on an electrically insulating layer. The electrically insulating layer of the resulting structure, which includes the originally formed dielectric layer 26 and the dielectric material 54 within the trenches 52, has a non-uniform thickness in embodiments where portions of the silicon fins 24 remain. As shown in FIG. 11, the electrically insulating layer is relatively thick beneath the silicon germanium fins 42 as the silicon fins 24 within the electrically insulating layer are vertically aligned with the trenches 52. The silicon germanium fins 42 are vertically aligned with the shallow trenches between the silicon fins 24. The silicon germanium fins have the composition $Si_{1-x}Ge_x$ where x is between 0.50-0.99 in some embodiments, and where x is 0.85 or greater in other embodiments. Fins having such high germanium contents have potential for use as channel materials for 7 nm and later CMOS technology nodes.

Once the structure 60 is obtained, gate structures (not shown) can be formed over the fin regions intended for use as channel regions. Dummy gates designed for later replacement can be formed in some embodiments. The dummy gates may comprise a dummy gate dielectric (e.g., oxide) covering fins and a dummy gate material (e.g., polysilicon) on top of the dummy gate dielectric. This dummy gate is removed in a later process familiar to those of skill in the art and a replacement metal gate composition is patterned at an appropriate stage of the transistor fabrication process. Alternatively, gate stacks including gate metal and gate dielectric layers are formed on the fins. Any gate pitch suitable for the intended application of the completed product may be chosen. If a gate-first process as described above is employed, gate materials may comprise a gate dielectric (e.g., high-k such as hafnium oxide) and a gate conductor (e.g., metal gate). Any suitable deposition techniques can be used to deposit high-k and metal gate. For example, gate dielectric can be deposited using techniques including but not limited to atomic layer deposition (ALD), chemical vapor deposition (CVD), physical vapor deposition (PVD), molecular beam deposition (MBD) or pulsed laser deposition (PLD). Metal deposition techniques for depositing gate electrode materials include but are not limited to CVD, PVD, ALD, sputtering and plating.

Expanded source/drain structures can be grown epitaxially on the exposed source/drain portions of the silicon germanium fins 42 while the channel regions are protected. In some embodiments, the silicon germanium fins are used to form pFET devices and are located in an electrically isolated pFET region. The nFET region(s) is protected by a mask during processing of the pFET region. Source/drain epitaxy to form p-doped source/drain regions may include the introduction of boron precursor gas such as diborane. The p-doped source/drain structures consist essentially of boron-doped silicon germanium in one or more exemplary embodiments. Silicon germanium epitaxy may include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). Epitaxial deposition of in-situ doped source/drain material is selective to the exposed areas of the silicon germanium fins Dopants contained within the epitaxial source/drain structures are driven into the source/drain regions of the fins upon annealing the structure.

The high-germanium-content fins 42 can also be employed in the fabrication of nFETs. In the nFET region of the structure, n-doped silicon germanium forms the source/drain regions. In an exemplary embodiment, the germanium content of the deposited material is fifty percent (50%) and the n-type dopant is phosphorus or arsenic.

The temperature for epitaxial deposition processes typically ranges from 550° C. to 900° C. Although higher temperature typically results in faster deposition, the faster deposition may result in crystal defects and film cracking. The silicon germanium layer source/drain regions can, for example, consist essentially of n-doped $Si_{1-y}Ge_y$ with y=0.5. The proportion of germanium to silicon of the silicon germanium source/drain regions is less than that in the silicon germanium fins 42. The germanium and silicon precursors (e.g. germane and silane) are introduced in the proper ratios to obtain the targeted germanium content of the source/drain regions. The n-type source/drain regions extend at least to the top surfaces of the fins 42 and extend above the fins in some embodiments. Deposition of the n-type source/drain material is selective to the exposed areas of the silicon germanium fins 42. The source/drain material does not grow in the regions between fins, which include the local oxide layer as shown in FIG. 11. The ratio of silicon and germanium precursors (e.g. silane and germane) is maintained constant during deposition to provide a substantially uniform ratio of silicon to germanium. Unlike graded silicon germanium deposits, ungraded source/drain regions provide uniform tensile strain in the nFET region. Technology relating to source/drain epitaxy is known to the art and continues to be developed. Further CMOS processing steps such as contact formation are performed in fabricating a finished product.

Figure 12:
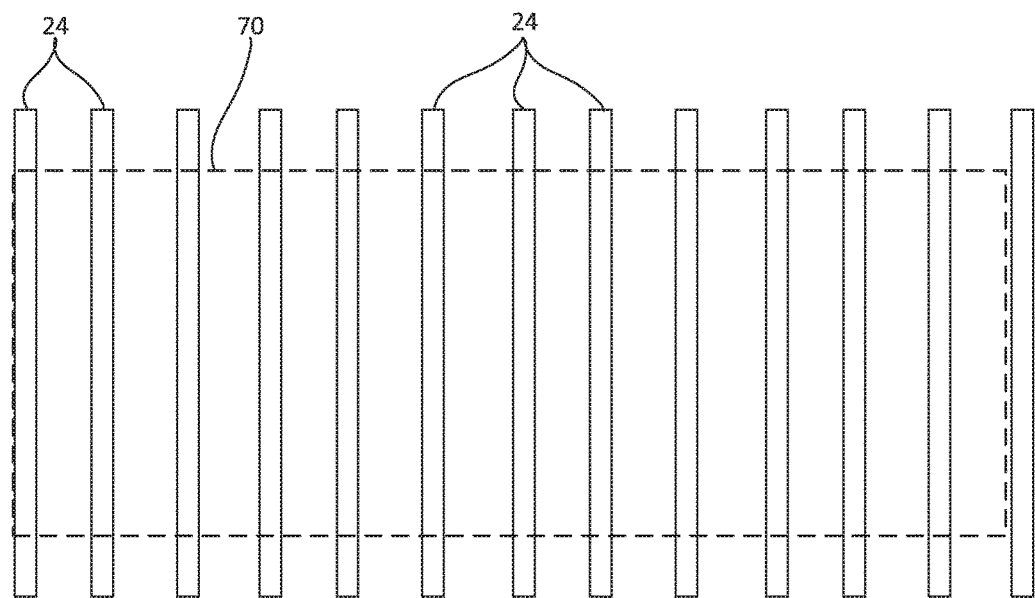
FIG. 12 is a schematic, top plan view showing an arrangement of fins of a bulk silicon substrate with respect to a SRAM boundary.

FIGS. 12-15 schematically illustrate the technology as discussed above as applied to a SRAM (static random access memory) layout. FIG. 12 shows an arrangement of silicon fins 24 with respect to a SRAM cell layout 70, which is shown in broken lines.

Figure 13:
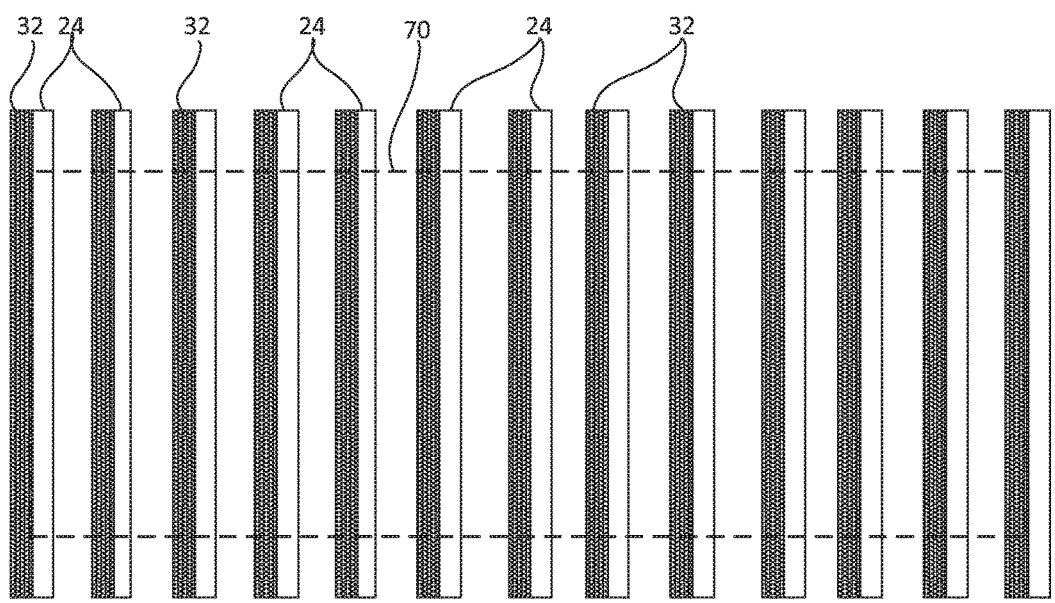
FIG. 13 is a schematic, top plan view showing the structure of FIG. 12 following formation of spacers on the fins.
Figure 14:
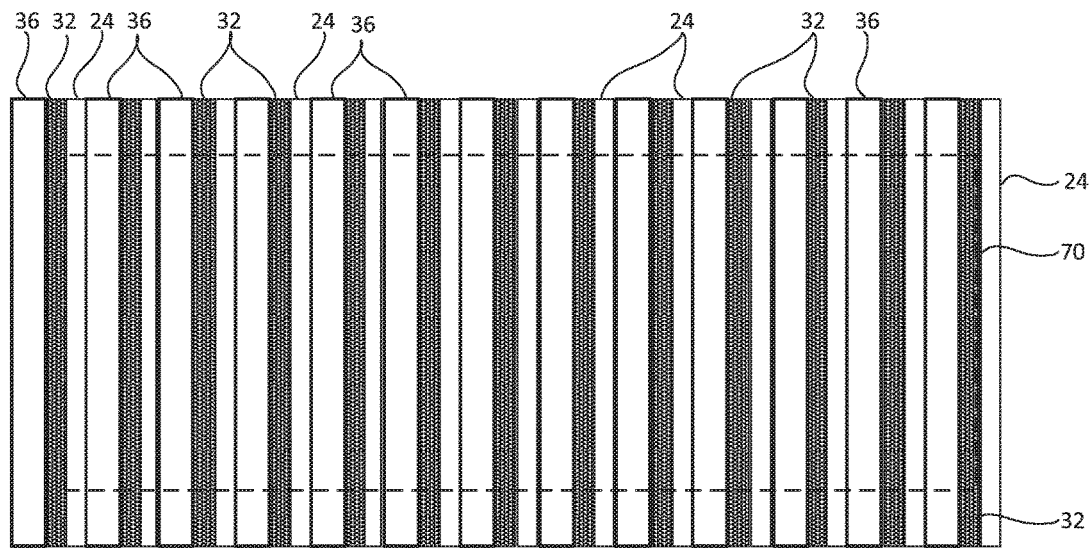
FIG. 14 is a schematic, top plan view showing the structure of FIG. 13 following the formation of metastable silicon germanium fins.
Figure 15:
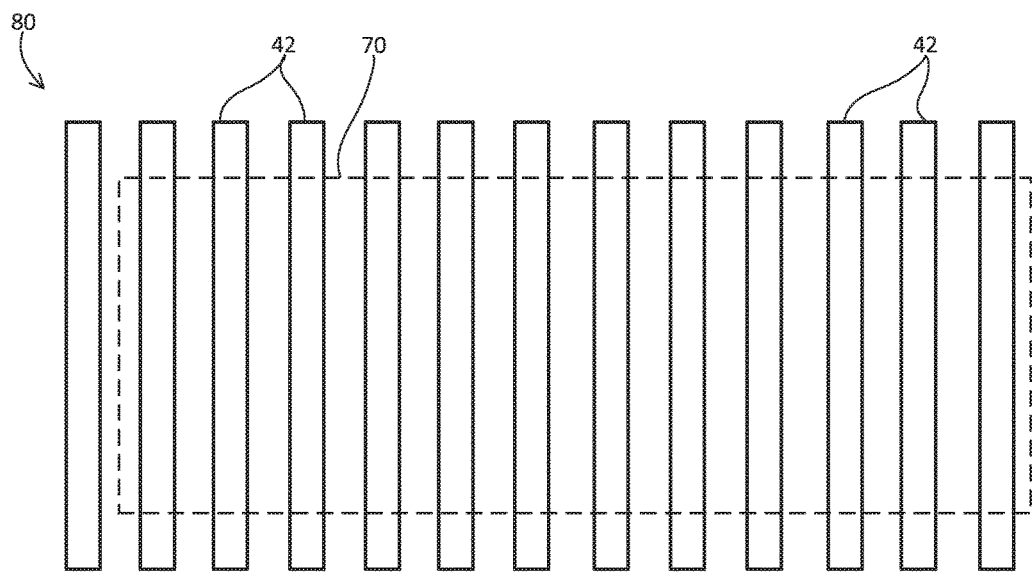
FIG. 15 is a schematic, top plan view showing the structure of FIG. 14 following removal of the spacers and recessing the fins of the bulk silicon substrate.

Asymmetric, left-side spacers 32 are formed on all fins using a process as discussed above with respect to FIGS. 2 and 3. FIG. 13 shows the structure following spacer formation. The formation of a metastable fin-on-STI (shallow trench isolation) structure using the liquid phase epitaxy (LPE) process described above with respect to FIG. 6 is shown in FIG. 14 with respect to the SRAM cell layout 70. The illustrated structure is similar to that shown in FIG. 8, following removal of an oxide cap layer. The nitride spacers 32 are removed and the silicon fins 24 are recessed to obtain the structure 80 shown in FIG. 15. The structure 80 includes relaxed, essentially defect-free crystalline silicon germanium fins 42, each being electrically isolated by the dielectric layer on which it is formed. As known in the art, SRAM devices include, inter alia, pFETs for pull up operations and nFETS for pull down operations. Fin grids as disclosed herein are used to form both pFETs and nFETs in some embodiments, such as in the CMOS fabrication of a SRAM cell. The fin-on-STI structure 80 is cut using masking/RIE techniques known to the art in accordance with the SRAM cell layout. Active fins are uncut or only partially cut. The fin(s) outside the layout 70 are cut; the entire SRAM device is built on a lattice of fins 42.

Given the discussion thus far and with reference to the exemplary embodiments discussed above and the drawings, it will be appreciated that, in general terms, an exemplary fabrication method includes obtaining a structure comprising a bulk silicon substrate 22 including a plurality of parallel silicon fins 24, a dielectric layer 26 on the substrate and extending between the silicon fins, and a spacer 32 adjoining a lateral side of each silicon fin. A layer 36 of silicon germanium is deposited on the substrate and between the fins. Crystalline silicon germanium fins 42 are formed on the dielectric layer 26 by annealing and then cooling the substrate 22, thereby causing liquid phase epitaxial regrowth of the silicon germanium layer 36. FIG. 6 schematically illustrates the annealing process in which a pulsed (nsec) laser is employed. The fabrication method further includes selectively recessing the silicon fins 24 (such as shown in FIG. 9), thereby forming trenches 52 between the silicon germanium fins 42. The spacers 32 are removed and an electrically insulating material 54 is deposited within the trenches. The method can be employed to obtain a finned structure including fully relaxed and substantially defect-free silicon germanium fins 42, such as the structure 60 shown in FIG. 11. The method can further include the steps of depositing a dielectric cap 38 on the substrate subsequent to depositing the layer 36 of silicon germanium, the dielectric cap covering the layer of silicon germanium, the silicon fins 24, and the spacers 32, and removing the dielectric cap after formation of the crystalline silicon germanium fins 42.

An exemplary finned semiconductor structure 60 includes a silicon substrate 22 and a plurality of parallel silicon fins 24 extending from the silicon substrate. A dielectric layer 26 on the silicon substrate covers the silicon fins. A plurality of relaxed parallel silicon germanium fins directly contacts a top surface of the dielectric layer 26. The silicon fins 24 are vertically aligned with trenches 52 between the silicon germanium fins. The silicon germanium fins have a composition of $Si_{1-x}Ge_x$ where x is 0.85 or greater in some embodiments. The top surface of the dielectric layer 26 is planar in some exemplary embodiments as the dielectric material deposited within the trenches 52 is removed down to the junction of the bottom surfaces of the silicon germanium fins 42 with the dielectric layer 26 on the bulk silicon substrate. The parallel trenches are bounded by the silicon germanium fins and the top surface of the dielectric layer. The silicon germanium fins are fully relaxed and substantially defect-free in exemplary embodiments and may have heights exceeding twenty-five nanometers.

Those skilled in the art will appreciate that the exemplary structures discussed above can be distributed in raw form or incorporated as parts of intermediate products or end products such as integrated circuits that benefit from having non-planar electronic devices such as FinFETs therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation. It should also be noted that, in some alternative implementations, the steps of the exemplary methods may occur out of the order noted in the figures. For example, two steps shown in succession may, in fact, be executed substantially concurrently, or certain steps may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A finned semiconductor structure comprising:
   a silicon substrate;
   a plurality of parallel silicon fins extending vertically from a top surface of the silicon substrate, wherein the plurality of parallel silicon fins are separated from each other by horizontal intervals, respectively;
   a dielectric layer on the silicon substrate and covering the silicon fins; and
   a plurality of relaxed parallel silicon germanium fins formed at the horizontal intervals, respectively, and directly contacting a top surface of the dielectric layer.

2. The finned semiconductor structure of claim 1, wherein the plurality of relaxed parallel silicon germanium fins each have a composition of $Si_{1-x}Ge_x$ where x is between 0.50-0.99.

3. The finned semiconductor structure of claim 2, wherein the plurality of relaxed parallel silicon germanium fins each are fully relaxed.

4. The finned semiconductor structure of claim 1, wherein the plurality of relaxed parallel silicon germanium fins each have a composition of $Si_{1-x}Ge_x$ where x is 0.85 or greater.

5. The finned semiconductor structure of claim 1, wherein the top surface of the dielectric layer is planar, and parallel trenches each are bounded by a respective one of the plurality of relaxed parallel silicon germanium fins and the top surface of the dielectric layer.

6. The finned semiconductor structure of claim 5, further comprising a dielectric material within the parallel trenches.

7. The finned semiconductor structure of claim 6, wherein the dielectric material is etched to a same level as the top surface of the dielectric layer.

8. The finned semiconductor structure of claim 7, wherein the dielectric material and the dielectric layer form an electrically insulating layer.

9. The finned semiconductor structure of claim 8, wherein the electrically insulating layer has a non-uniform thickness.

10. The finned semiconductor structure of claim 9, wherein the plurality of relaxed parallel silicon germanium fins are boated above a surface of the plurality of parallel silicon fins.

11. The finned semiconductor structure of claim 10, wherein the plurality of relaxed parallel silicon germanium fins are boated above a surface of the electrically insulating layer.

12. The finned semiconductor structure of claim 11, wherein the plurality of relaxed parallel silicon germanium fins are located at a level different than that of the plurality of parallel silicon fins.

13. The finned semiconductor structure of claim 1, wherein the plurality of relaxed parallel silicon germanium fins each have a height exceeding twenty-five nanometers.

14. The finned semiconductor structure of claim 1, wherein the substrate is a bulk silicon substrate.

15. The finned semiconductor structure of claim 14, wherein the plurality of relaxed parallel silicon germanium fins each are fully relaxed.

* * * * *

UNITED STATES PATENT AND TRADEMARK OFFICE
CERTIFICATE OF CORRECTION

PATENT NO. : 10,068,920 B2
APPLICATION NO. : 15/098722
DATED : September 4, 2018
INVENTOR(S) : Alexander Reznicek et al.

Page 1 of 1

It is certified that error appears in the above-identified patent and that said Letters Patent is hereby corrected as shown below:

In the Claims

In Claim 10, Line 13 at Column 10, change "boated" to "located".

In Claim 11, Line 17 at Column 10, change "boated" to "located".

Signed and Sealed this
Sixth Day of November, 2018

Andrei Iancu
*Director of the United States Patent and Trademark Office*